US010236611B2

(12) United States Patent
Peralta et al.

(10) Patent No.: US 10,236,611 B2
(45) Date of Patent: Mar. 19, 2019

(54) ELECTRICAL INTERFACES USING MODULAR VPX TECHNOLOGIES

(71) Applicant: Raytheon Company, Waltham, MA (US)

(72) Inventors: Carlos Peralta, Rancho Palos Verdes, CA (US); Kevin M. Nakano, Torrance, CA (US); Christal J. Sumner, Torrance, CA (US); John P. Norbutas, Camarillo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/816,724

(22) Filed: Nov. 17, 2017

(65) Prior Publication Data
US 2018/0145435 A1 May 24, 2018

Related U.S. Application Data

(60) Provisional application No. 62/424,687, filed on Nov. 21, 2016.

(51) Int. Cl.
*H01R 12/00* (2006.01)
*H01R 12/79* (2011.01)
(Continued)

(52) U.S. Cl.
CPC .............. *H01R 12/79* (2013.01); *H01R 12/73* (2013.01); *H05K 1/144* (2013.01); *H05K 1/147* (2013.01);
(Continued)

(58) Field of Classification Search
CPC .................. H01R 12/79; H01R 12/716; H05K 2201/10356; H05K 2201/042; H05K 1/144
See application file for complete search history.

(56) References Cited

U.S. PATENT DOCUMENTS 4,644,092 A * 2/1987 Gentry ................. H01B 7/0838
174/102 C
4,861,272 A 8/1989 Clark
(Continued)

FOREIGN PATENT DOCUMENTS

CN 202404583 U 8/2012
CN 103593008 A 2/2014
(Continued)

OTHER PUBLICATIONS

PCT International Search Report and Written Opinion; International Application No. PCT/US2017/062473; International Filing Date: Nov. 20, 2017; dated Feb. 13, 2018; pp. 11.

*Primary Examiner* — Xuong Chung Trans
(74) *Attorney, Agent, or Firm* — Cantor Colburn LLP

(57) ABSTRACT

A printed circuit board assembly and method for electrically communicating between a first printed circuit board and a second printed circuit board is disclosed. The method includes coupling the first printed circuit board to the second printed circuit board via an electrical communication cable. The electrical communication cable includes a VPX-compliant electrical interface, a flat flex interface, and a flexible cable that electrically couples the VPX-compliant electrical interface to the flat flex interface; and electrically communicating over the electrical communication cable.

17 Claims, 5 Drawing Sheets

(51) Int. Cl.
*H05K 1/14* (2006.01)
*H01R 12/73* (2011.01)
*H01R 12/71* (2011.01)

(52) U.S. Cl.
CPC ...... *H01R 12/716* (2013.01); *H05K 2201/042* (2013.01); *H05K 2201/044* (2013.01); *H05K 2201/10189* (2013.01); *H05K 2201/10356* (2013.01)

(56) References Cited

U.S. PATENT DOCUMENTS

| | | | |
|---|---|---|---|
| 6,200,142 B1 * | 3/2001 | Soh | H01R 12/61 439/67 |
| 6,380,758 B1 | 4/2002 | Hsu et al. | |
| 6,617,518 B2 * | 9/2003 | Ames | H01R 12/592 174/254 |
| 6,971,887 B1 * | 12/2005 | Trobough | H05K 7/1092 439/71 |
| 8,867,231 B2 * | 10/2014 | Roitberg | H01L 23/50 361/729 |
| 9,590,338 B1 * | 3/2017 | Schmitt | H01R 12/718 |
| 9,664,868 B2 * | 5/2017 | Logan, Jr. | G02B 6/4293 |
| 9,716,337 B2 * | 7/2017 | Keuten | H01R 12/62 |
| 2010/0307798 A1 | 12/2010 | Izadian | |
| 2016/0056554 A1 | 2/2016 | Costello | |

FOREIGN PATENT DOCUMENTS

| | | |
|---|---|---|
| CN | 203561933 U | 4/2014 |
| CN | 10377716 A | 5/2014 |

* cited by examiner

ELECTRICAL INTERFACES USING MODULAR VPX TECHNOLOGIES

CROSS REFERENCE TO RELATED APPLICATIONS

The present invention claims priority to U.S. Provisional Application Ser. No. 62/424,687, filed Nov. 21, 2016, the contents of which are incorporated herein by reference in their entirety.

BACKGROUND

The present disclosure relates generally to a method of interfacing between modular printed circuit boards (PCBs) in an electrical chassis and, more particularly, to using a modular controlled-impedance cable supporting the "VME (Versa Module Europa) International Trade Association-46" (VITA-46) standards as an interconnect cable for command, control, and power signals.

The use of the VITA-46 standards, (later named VPX, for VME/Peripheral Component Interconnect/Crossover) protocols and VPX-compliant connections for interconnections between modular PCBs is common in the industry. With the continuing advancement in processor technology and memory, modular PCBs demand more reliable interconnections that can support increased bandwidth and data flow. VPX technology and standards can support high data rates (up to 10 Gbps and beyond) but are limited by the chassis infrastructure, including backplane and interconnection limitations.

SUMMARY

According to one embodiment of the present disclosure, an electrical communication cable includes: a VPX-compliant electrical interface configured to removably couple to a first printed circuit board; a flat flex interface configured to removably couple to a second printed circuit board; and a flat flexible cable fixably coupled to the VPX-compliant electrical interface and to the flat flex interface to provide electrical communication between the first printed circuit board and the second printed circuit board.

According to another embodiment of the present disclosure, a printed circuit board assembly includes: a first printed circuit board disposed in a chassis; a second printed circuit board disposed in the chassis; and an electrical communication cable for connecting the first circuit board to the second circuit board, the electrical communication cable comprising: a VPX-compliant electrical interface configured to removably couple to the first printed circuit board; a flat flex interface configured to removably couple to the second printed circuit board; and a flexible cable fixably coupled to the VPX-compliant electrical interface and to the flat flex interface to provide a connection between the first printed circuit board and the second printed circuit board.

According to another embodiment of the present disclosure, a method for electrically communicating between a first printed circuit board to a second printed circuit board includes: coupling the first printed circuit board disposed in a chassis to the second printed circuit board disposed in the chassis via an electrical communication cable that includes a VPX-compliant electrical interface, a flat flex interface, and a flexible cable that electrically couples the VPX-compliant electrical interface to the flat flex interface; and electrically communicating over the electrical communication cable.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
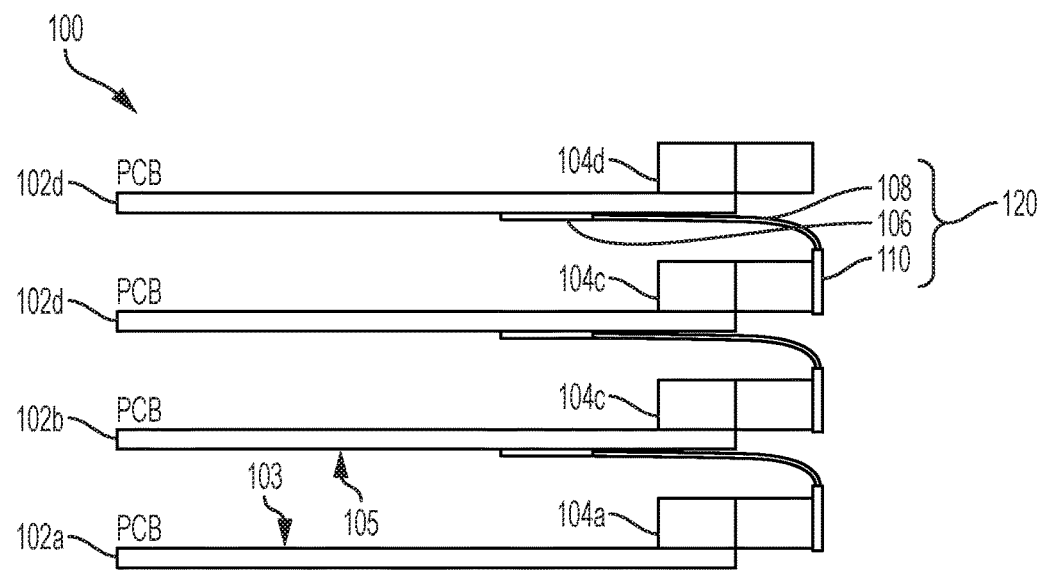
FIG. 1 is a side view of a PCB assembly with a plurality of PCBs using a modular VPX interconnect cable.

The present disclosure describes particular embodiments including an apparatus and method for connecting electronic circuit boards for electronic communication between them. As used herein, an "electronic circuit board" includes, but is not limited to, a printed circuit board (PCB) and other electronic products formed in a similar manner to PCBs described in a manner herein.

As used herein, a "component" includes, but is not limited to, devices that may be affixed to a PCB or any other suitable electronic product. Such components include capacitors, resistors, integrated circuits, processors, logic chips, other chips, or other devices. Such components may be affixed and electrically connected to the electronic circuit board via soldering. In some instances, a component may have a standoff height of about ½ mil (12.7 micrometers) resulting in only ½ mil (12.7 micrometers) clearance between the component and the underlying board.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection. It should be understood that throughout the drawings, corresponding reference numerals indicate like or corresponding parts and features. As used herein, the term module, unit and/or element can be formed as processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

VPX is an American National Standards Institute (ANSI) standard (ANSI/VITA 46.0-2007) which provides VME-based systems with support for switched fabrics over a high speed connector. Defined by the VITA-46 working group, the standard has been designed specifically with defense applications in mind, with an enhanced module standard that enables applications and platforms with superior performance. VPX retains VME's existing 6 U and 3 U Eurocard form factors, supporting existing PCI Mezzanine Card (PMC) and XMC mezzanines (PMC with high-speed serial fabric interconnect), and maintaining the maximum possible compatibility with VMEbus.

New generations of embedded systems based on the VPX standard reflects the growing significance of high speed serial switched fabric interconnects such as PCI Express, RapidIO, Infiniband, and 10 Gigabit Ethernet. These technologies are replacing traditional parallel communications bus architectures for local communications, because they offer significantly greater capability. Switched fabrics technology supports the implementation of multiprocessing systems that require the fastest possible communications between multiple processors (e.g., digital signal processing applications). VPX gives the large existing base of VMEbus users access to these switched fabrics.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element is present on a second element where intervening elements can be present between the first element and the second element. The term "direct contact" means that a first element and a second element are connected without any intermediary elements at the interface of the two elements.

FIG. 1 is a side view of a PCB assembly 100 including a plurality of printed circuit boards (PCBs) 102a, 102b, 102c and 102d. The printed circuit boards 102a, 102b, 102c and 102d are disposed in a chassis (not shown) or other housing structure in a stacked array. A first PCB 102a is disposed at a bottom of, or at one end of, the chassis and the second PCB 102b is disposed on top of, or next to the first PCB 102a. As arranged in the chassis, the bottom side 105 of the second PCB 102b is facing the top side 103 of the first PCB 102a. The third PCB 102c and fourth PCB 102d are similarly arranged in the chassis so that the bottom surface of one PCB faces the top surface of the lower PCB. A selected PCB can include a plurality of pins at its top surface (such as top surface 103 of first PCB 102a) for providing an electrical connection or communication to a PCB (such as second PCB 102b) above it in the stack. Additionally, a selected PCB can include a plurality of pins at its bottom surface (such as bottom surface 105 of second PCB 102b) for providing electrically connection or communication to a PCB (such as first PCB 102a) below it in the stack. In various embodiments, the pins of PCBs 102a, 102b, 102c and 102b are compliant with VPX communication standards.

Each PCB 102a-d is shown having a VPX backplane connector 104a-d that can be affixed, fastened and/or fixably attached to its respective PCB 102a-d. The VPX backplane connectors 104a-d are designed to connect to the pins at the top surface of their respective PCBs 102a-d and to interface at another end to a cable or backplane. The VPX backplane connectors 104a-d provide communication channels for command, control, and power signals between connected PCBs. As illustrated in FIG. 1, VPX backplane connector 104a provides communication channels between first PCB 102a and second PCB 102b, VPX backplane connector 104b provides communication channels between second PCB 102b and third PCB 102c, and VPX backplane connector 104c provides communication channels between third PCB 102c and fourth PCB 102d. In various embodiments, a flexible cable electrically couples a PCB to another PCB by interfacing to the VPX backplane connector of one PCB and to a connector at a back surface of another PCB. An exemplary flexible VPX interconnect cable 120 is shown connecting third PCB 102c to fourth PCB 102d. The VPX interconnect cable 120 (also referred to herein as "electrical communication cable") can be a modular cable in one embodiment and can therefore be used to connect any of the PCBs 102a-d to a nearby PCB in the array.

Figure 2:
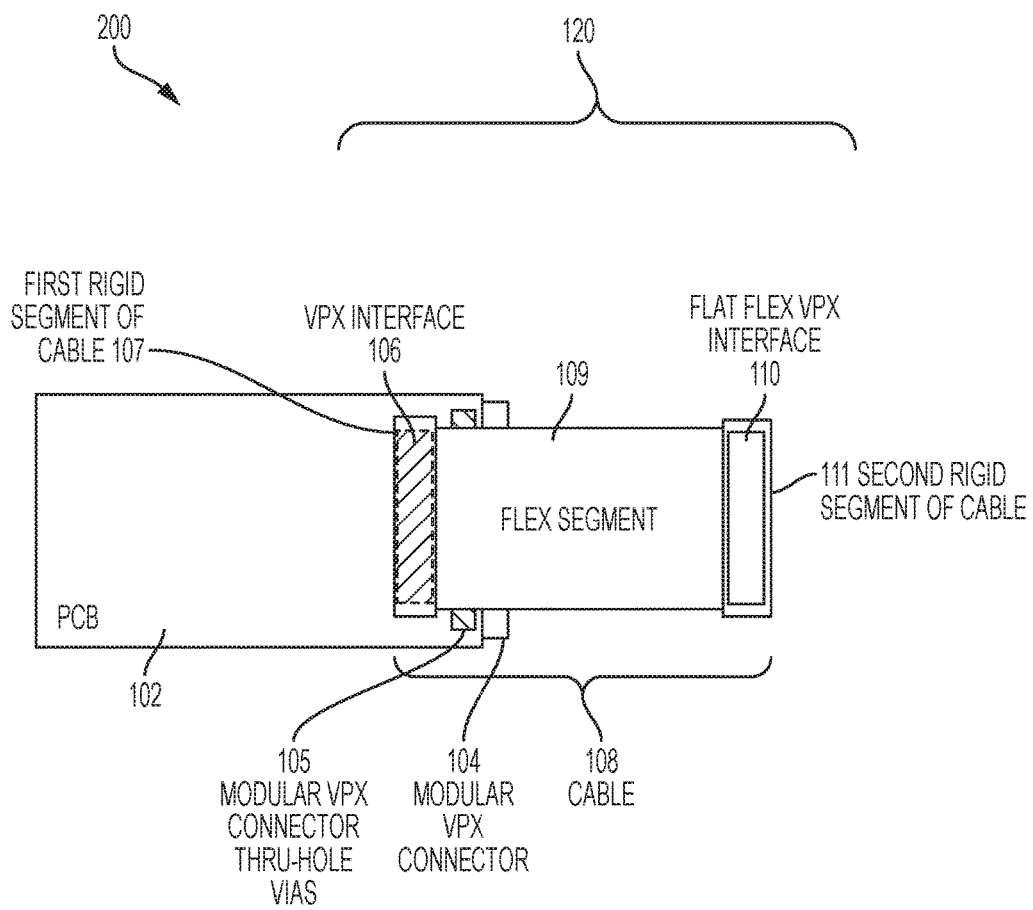
FIG. 2 is a top view showing a PCB assembly with a PCB attached to a VPX interconnect cable of the present invention.

FIG. 2 is a bottom view of the PCB assembly 100 of FIG. 1. FIG. 2 shows an illustrative PCB 102 attached to a VPX interconnect cable 120 in an embodiment of the present invention. VPX interconnect cable 120 includes three components: a flat flexible cable 108, a flat flex interface 106, and a VPX interface 110 which can be a VPX-compliant electrical interface. The flat flexible cable 108 includes a flexible segment 109 having a first rigid segment 107 at one end of the flexible segment 109 and a second rigid segment 111 at an opposite end of the flexible segment 109, with a plurality of electrical conductors traversing the flexible segment 109 from the first rigid segment 107 to the second rigid segment 111. In various embodiments, the electrical conductors are copper ribbons having one ounce copper thickness (i.e., about ⅟1000 of an inch thickness) and encased by a flexible material of the flexible segment 109. The flat flex interface 106 is mounted onto the flat flexible cable 108 at the first rigid segment 107, and the VPX interface 110 is mounted onto the flat flexible cable 108 at the second rigid segment 111. A modular VPX backplane connector 104 is mounted on the top side of the PCB 102. A plurality of through-hole vias 115 project through the PCB 102 to allow the modular VPX backplane connector 104 to connect to the PCB 102. The VPX interconnect cable 120 is attached to the bottom surface of the PCB 102 via the flat flex interface 106.

Figure 3:
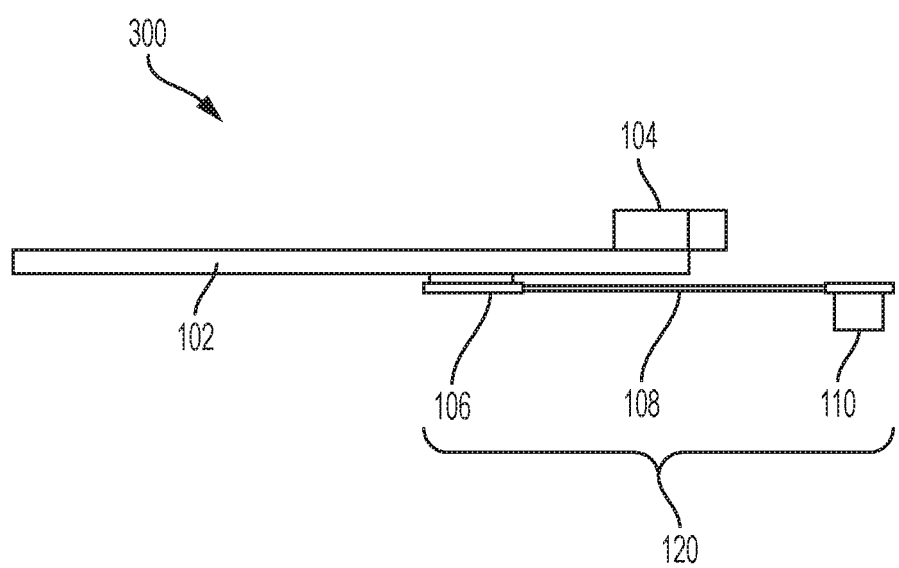
FIG. 3 is a side view of a PCB assembly with the modular VPX interconnect cable attached to a PCB.

FIG. 3 is a side view of a PCB 102 with the modular VPX interconnect cable 120 attached to the PCB 102. The VPX interconnect cable is shown affixed to the PCB 102 by coupling the flat flex connector 106 to a bottom side of the PCB 102.

Figure 4:
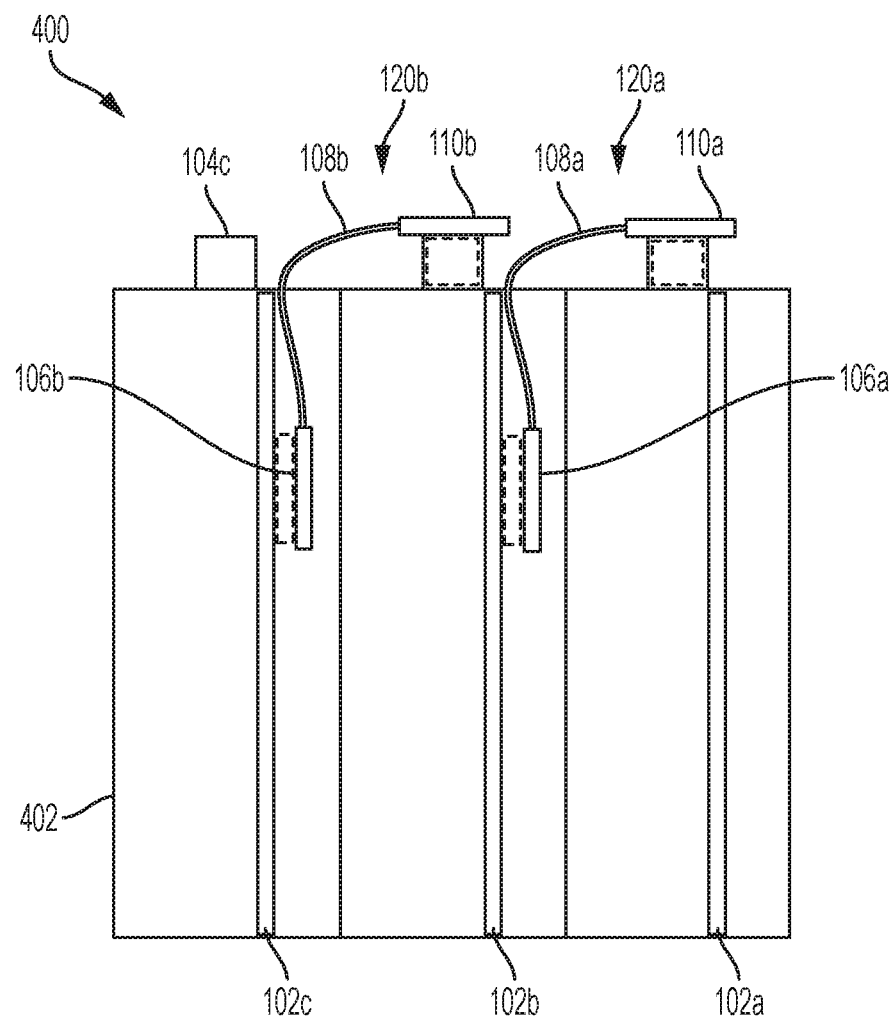
FIG. 4 is a side view of a PCB assembly with multiple PCBs using a modular VPX interconnect cable.

FIG. 4 is a side view of a PCB assembly 400 with multiple PCBs 102a-c. The multiple PCBs 102a-c are disposed in a chassis 402 or other rigid housing. The PCBs 102a-c are arranged in an array so that their associated VPX backplane connectors (e.g., VPX backplane connector 104c) are accessible outside of the chassis 402. VPX interconnect cables 120a and 120b are used to connect PCBs 102a-c. The VPX interface 110a of VPX interconnect cable 120a connects to the VPX backplane connector of first PCB 102a and the flat flex interface 106a of the VPX interconnect cable 120a connects to the back surface of the second PCB 102b. Similarly, the VPX interface 110b of VPX interconnect cable 120b connects to the VPX backplane connector of first PCB 102b and the flat flex interface 106b of the VPX interconnect cable 102b connects to the back surface of the second PCB 102c. The flat flex interfaces 106a and 106b can be connected to their respective PCBs 102b and 102c prior to disposing the PCBs 102b and 102c in the chassis 402, in order to facilitate forming the electrical connection between the PCBs. As shown, the flat flexible cables 108 and 108b are folded in order to connect the VPX interfaces 110a and 110b to their respective VPX backplane connectors.

Figure 5:
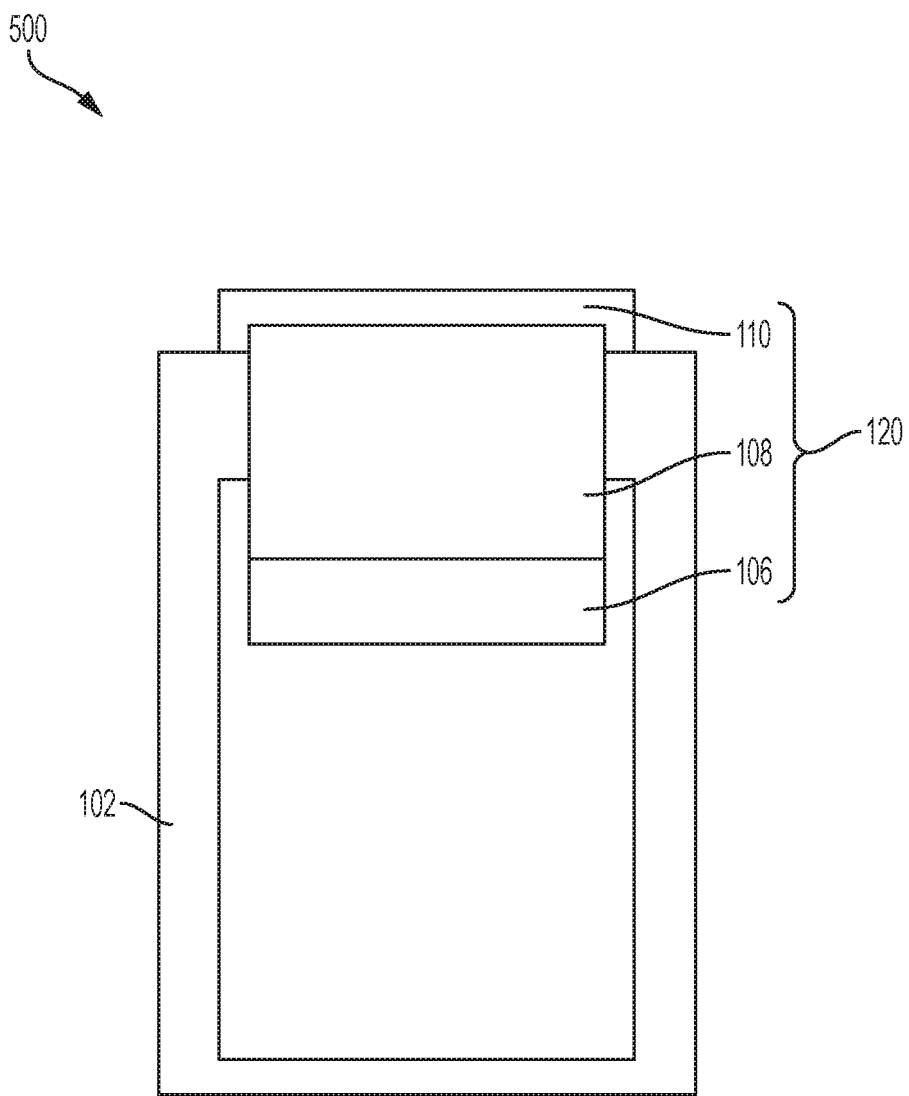
FIG. 5 is a top view showing a PCB assembly with multiple PCBs using the modular VPX interconnect cable.

FIG. 5 is a top view showing a PCB assembly 500 with multiple PCBs 102 using the modular VPX interconnect cable 120 in lieu of a backplane.

In various embodiments, the printed circuit boards 102a-d are 3 U Form Factor boards that are about 4 inches by 6 inches. The printed circuit boards 102a-d are designed to be mechanically the same as a standard VPX board with additional connections to accept the aforementioned flex-circuits for connectivity. In order to connect the printed circuit boards 102a-d, the user can use the interleaving flex circuits without using a backplane or requiring a particular chassis design. Alternatively, the user can use the module as a standard 3 U VPX module in a standard chassis design.

Therefore, the present invention provides an electrical cable including: a VPX-compliant electrical interface configured to removably couple to a first printed circuit board; a flat flex interface configured to removably couple to a second printed circuit board; and a flat flexible cable fixably coupled to the VPX-compliant electrical interface and to the flat flex interface to provide electrical communication between the first printed circuit board and the second printed circuit board. The flexible cable can include a controlled-impedance cable. The flexible cable can include electrically conductive copper ribbons and the thickness of the copper ribbons can be of about one-ounce copper thickness. The flexible cable communicates at least one of command, control, and power signals between the first printed circuit board and the second circuit board. The flexible cable is capable of transmitting at least 10 Gbps of data transfer between the first printed circuit board and the second printed circuit board. In one embodiment, the first printed circuit board includes an affixed VPX backplane connector and the VPX-compliant electrical interface is configured to removably couple to the VPX backplane connector. When disposed in an array of printed circuit boards with a top surface of the first printed circuit board facing a back surface of the second printed circuit board, the VPX backplane connector is affixed to the top surface of the first printed circuit board.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An electrical communication cable, comprising:
a flat flexible cable having a flexible segment, a first rigid segment at one end of the flexible segment and a second rigid segment at an opposite end of the flexible segment
a flat flex interface mounted to the first rigid segment; and
a VPX-compliant electrical interface mounted to the second rigid segment;
wherein the VPX-compliant electrical interface is configured to removably couple to a first printed circuit board and the flat flex interface is configured to removably couple to the second printed circuit board to provide electrical communication between the first printed circuit board and the second printed circuit board.

2. The electrical communication cable of claim 1, wherein the flexible cable comprises a controlled-impedance cable.

3. The electrical communication cable of claim 1, wherein the flexible cable further comprises electrically conductive copper ribbons having about a one-ounce copper thickness.

4. The electrical communication cable of claim 1, wherein the flexible cable communicates at least one of command, control, and power signals between the first printed circuit board and the second circuit board.

5. The electrical communication cable of claim 1, wherein the flexible cable transmits at least 10 Gbps of data transfer between the first printed circuit board and the second printed circuit board.

6. A printed circuit board assembly, comprising:
a first printed circuit board disposed in a chassis;
a second printed circuit board disposed in the chassis, wherein the top side of the first printed circuit board is facing a bottom side of the second printed circuit board; and
an electrical communication cable for connecting the first circuit board to the second circuit board, the electrical communication cable comprising:
a flat flexible cable having a flexible segment, a first rigid segment at one end of the flexible segment and a second rigid segment at an opposite end of the flexible segment
a flat flex interface mounted to the first rigid segment; and
a VPX-compliant electrical interface mounted to the second rigid segment, wherein the VPX-compliant electrical interface is configured to removably couple to the first printed circuit board and the flat flex interface is configured to removably couple to the second printed circuit board to provide electrical communication between the first printed circuit board and the second printed circuit board.

7. The printed circuit board assembly of claim 6, wherein the flexible cable comprises a controlled-impedance cable.

8. The printed circuit board assembly of claim 6, wherein the flexible cable further comprises electrically conductive copper ribbons having about a one-ounce copper thickness.

9. The printed circuit board assembly of claim 6, wherein the electrical communication cable communicates command, control, and power signals between the first printed circuit board and the second circuit board.

10. The printed circuit board assembly of claim 6, wherein a VPX backplane connector is coupled to a top surface of the first circuit board and the VPX-compliant electrical interface couples to the VPX backplane connector.

11. The printed circuit board assembly of claim 6, wherein the electrical communication cable transmits at least 10 Gbps of data transfer between the first printed circuit board and the second printed circuit board.

12. The printed circuit board assembly of claim 6, further comprising a third printed circuit board disposed in the chassis at a location above the second printed circuit board, wherein the electrical communication cable is a modular cable that can couple the second printed circuit board to the third printed circuit board.

13. The printed circuit board assembly of claim 6, further comprising transmitting at least 10 Gbps between the first printed circuit board and the second printed circuit board using the electrical communication cable.

14. A method for electrically communicating between a first printed circuit board to a second printed circuit board, comprising:
coupling the first printed circuit board to a chassis;
coupling a flat flex interface of an electrical communication cable to a bottom side of a second printed circuit board, the electrical communication cable including a flat flexible cable having a flexible segment, a first rigid segment at one end of the flexible segment and a second rigid segment at an opposite end of the flexible segment, a flat flex interface mounted to the first rigid segment, and a VPX-compliant electrical interface mounted to the second rigid segment;
coupling the second printed circuit board to the chassis with a top surface of the first printed circuit board facing the bottom surface of the second printed board;
coupling the VPX-compliant electrical interface to the first printed circuit board; and
electrically communicating over the electrical communication cable.

15. The method of claim 14, wherein a VPX backplane connector is coupled to the first printed circuit board, the method further comprising coupling the VPX-compliant electrical interface to the VPX backplane connector.

16. The method of claim 14, wherein electrically communicating between the first printed circuit board and the second printed circuit board further comprising transmitting at least one of (i) a command signal; (ii) a control signal and (iii) a power signal over the electrical communication cable.

17. The method of claim 14, further comprising electrically communicating over the flexible cable having about a one-ounce cooper thickness.

* * * * *